(12) United States Patent
Zuo

(10) Patent No.: US 10,172,236 B2
(45) Date of Patent: Jan. 1, 2019

(54) NARROW FRAME DISPLAY PANEL AND DISPLAY

(71) Applicant: Wuhan China Star Optoelectronics Technology Co., Ltd., Wuhan, Hubei (CN)

(72) Inventor: Qingcheng Zuo, Guangdong (CN)

(73) Assignee: Wuhan China Star Optoelectronics Technology Co., Ltd, Wuhan, Hubei (CN)

(*) Notice: Subject to any disclaimer, the term of this patent is extended or adjusted under 35 U.S.C. 154(b) by 0 days.

(21) Appl. No.: 15/543,995

(22) PCT Filed: May 9, 2017

(86) PCT No.: PCT/CN2017/083635
§ 371 (c)(1),
(2) Date: Jul. 15, 2017

(65) Prior Publication Data
US 2018/0338377 A1 Nov. 22, 2018

(51) Int. Cl.
*H05K 1/14* (2006.01)
*H05K 1/11* (2006.01)

(52) U.S. Cl.
CPC .......... *H05K 1/147* (2013.01); *H05K 1/118* (2013.01); *H05K 2201/0939* (2013.01); *H05K 2201/10128* (2013.01)

(58) Field of Classification Search
USPC .................................. 361/749, 767
See application file for complete search history.

(56) References Cited

U.S. PATENT DOCUMENTS

2010/0195351 A1* 8/2010 Ueyama ............... G02B 6/0068
362/613
2015/0160500 A1* 6/2015 Ikuta ................... G02F 1/13452
349/150

* cited by examiner

*Primary Examiner* — Andargie M Aychillhum
(74) *Attorney, Agent, or Firm* — Andrew C. Cheng

(57) ABSTRACT

The embodiment of the present invention discloses a narrow frame display panel, comprising: an integrated circuit input pad, being located on a lower side of the display panel and comprising a plurality of input terminals; a flexible printed circuit bonding pad, being located on a lower edge of the display panel and below the integrated circuit input pad, and the flexible printed circuit bonding pad comprising a plurality of bonding terminals, and bonding terminals of at least one end of the flexible printed circuit bonding pad are first bonding terminals, wherein each of the first bonding terminals comprising at least one three-side bracketing structure extending outward in a horizontal direction; wires, electrically connecting the integrated circuit input pad with the flexible printed circuit bonding pad. The embodiment of the present invention further discloses a display. By utilizing the present invention, being advantageous for narrow frame design is achieved.

18 Claims, 2 Drawing Sheets

NARROW FRAME DISPLAY PANEL AND DISPLAY

CROSS REFERENCE

This application claims the priority of Chinese Patent Application No. 201710260964.3, entitled "Narrow frame display panel and display", filed on Apr. 20, 2017, the disclosure of which is incorporated herein by reference in its entirety.

FIELD OF THE INVENTION

The present invention relates to a display technology field, and more particularly to a narrow frame display panel and a display.

BACKGROUND OF THE INVENTION

The display panel of prior art, such as the liquid crystal display panel is shown in FIG. 1. The display panel simply comprises an active area (AA) 100 and a peripheral area 200. The peripheral area 200 comprises an IC input Pad (integrated circuit input pad) 210 and a FPC Bonding Pad (flexible printed circuit bonding pad) 220. Specifically, the display panel comprises the IC input Pad (integrated circuit input pad) 210 and the FPC Bonding Pad (flexible printed circuit bonding pad) 220 on the lower side. The IC input Pad 210 is electrically connected to the integrated circuit board, and the FPC Bonding Pad 220 is electrically connected to the flexible printed circuit (FPC) board. The IC input Pad 210 comprises a plurality of input terminals 211. The FPC Bonding Pad 220 comprises a plurality of bonding terminals 221 which are equal in length. The plurality of input terminals 211 are electrically connected to the plurality of bonding terminals 221 correspondingly via wires 230.

As the FPC Bonding Pad 220 is electrically connected to the IC input Pad 210 via the wires 230, and as the wires 230 are more gentle (smaller slope), referring to the dotted circle marked part of the enlarged area of FIG. 1, the wire 230 is close to the adjacent bonding terminal 221 due to the etching and other factors, which is likely to cause short circuit, and the short circuit risk is higher; as the wires 230 are more steep (larger slope), the width of the area of the wires 230 gets wider. Namely, the area between the FPC Bonding Pad 220 and the IC input Pad 210 gets wider, which is disadvantageous for narrow frame design of the display panel. Besides, if the FPC Bonding Pad 220 utilizes the bonding terminals 221 which are not equal in length, there will be the problem of insufficient electrical connection area between the FPC Bonding Pad and the FPC board.

SUMMARY OF THE INVENTION

The technical issue that the embodiment of the present invention solves is to provide a narrow frame display panel and a display, which is advantageous for narrow frame design.

For solving the aforesaid technical issue, the present invention first provides a narrow frame display panel, comprising:

an integrated circuit input pad, being located on a lower side of the display panel and comprising a plurality of input terminals;

a flexible printed circuit bonding pad, being located on a lower edge of the display panel and below the integrated circuit input pad, and the flexible printed circuit bonding pad comprising a plurality of bonding terminals, and bonding terminals of at least one end of the flexible printed circuit bonding pad are first bonding terminals, wherein each of the first bonding terminals comprising at least one three-side bracketing structure extending outward in a horizontal direction;

wires, electrically connecting the integrated circuit input pad with the flexible printed circuit bonding pad.

Bonding terminals at left and right end of the flexible printed circuit bonding pad are the first bonding terminals.

A number of the bonding terminals at one end, which are the first bonding terminals, is at least two, and each of the first bonding terminals comprises a vertical part and a bent part, and the bent part is connected to one end of the vertical part and horizontally extends toward a center position of the flexible printed circuit bonding pad, and a length of the vertical part is smaller than a length of other bonding terminals except the first bonding terminals, and the vertical part is located on a same horizontal line as ends of the other bonding terminals remote from the wires except the first bonding terminals.

The vertical parts of the at least two first bonding terminals are gradually shortened toward the center position of the flexible printed circuit bonding pad.

The other bonding terminals except the first bonding terminals are elongated long strips which are equal in length.

The wires are electrically connected to ends of the bent parts remote from the vertical parts.

The each of the first bonding terminals comprises two three-side bracketing structures, and one of the two three-side bracketing structures is a positive three-side bracketing structure and the other is an inverted three-side bracketing structure.

The three-side bracketing structure is a U-type structure, a C-type structure, an inverted U-shaped structure or an inverted C-type structure.

Angles between wires electrically connected to the first bonding terminals and a horizontal line are larger than angles between wires electrically connected to other bonding terminals adjacent to the first bonding terminals.

Second, the embodiment of the present invention provides a display, comprising:

a display panel, which is the aforesaid display panel;

a flexible printed circuit board, being electrically connected to the flexible printed circuit bonding pad;

an integrated circuit board, being electrically connected to the integrated circuit input pad.

With implementing the embodiments of the present invention, the benefits are: bonding terminals of at least one end of the flexible printed circuit bonding pad are first bonding terminals, wherein each of the first bonding terminals comprises at least one three-side bracketing structure extending outward in a horizontal direction, therefore with the space expansion of the flexible printed circuit bonding pad in the horizontal direction, the wires electrically connected to the other bonding terminals adjacent to the first bonding terminals can be more gentle. Then, the distance between the integrated circuit input pad and the flexible printed circuit bonding pad can be decreased, thus being advantageous for narrow frame design of the display panel and the short circuit risk is low; besides, because the first bonding terminal comprises at least one three-side bracketing structure extending outward in the horizontal direction, which is advantageous for the increase of the electrical connection area, there is no problem of insufficient electrical connection area.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Furthermore, the terms "including" and "having" and their any deformations are intended to cover non-exclusive inclusion. For example, a process, a method, a system, a product or a device comprising a series of steps or units which is not limited to the steps or units already listed, but optionally further comprises steps or units which are not listed, or optionally further comprises other steps or units which are inherent in these the process, the method, the product or the device. The terminologies "first", "second" and "third" are used for distinguishing different objects but not for describing the specific sequence.

Figure 1:
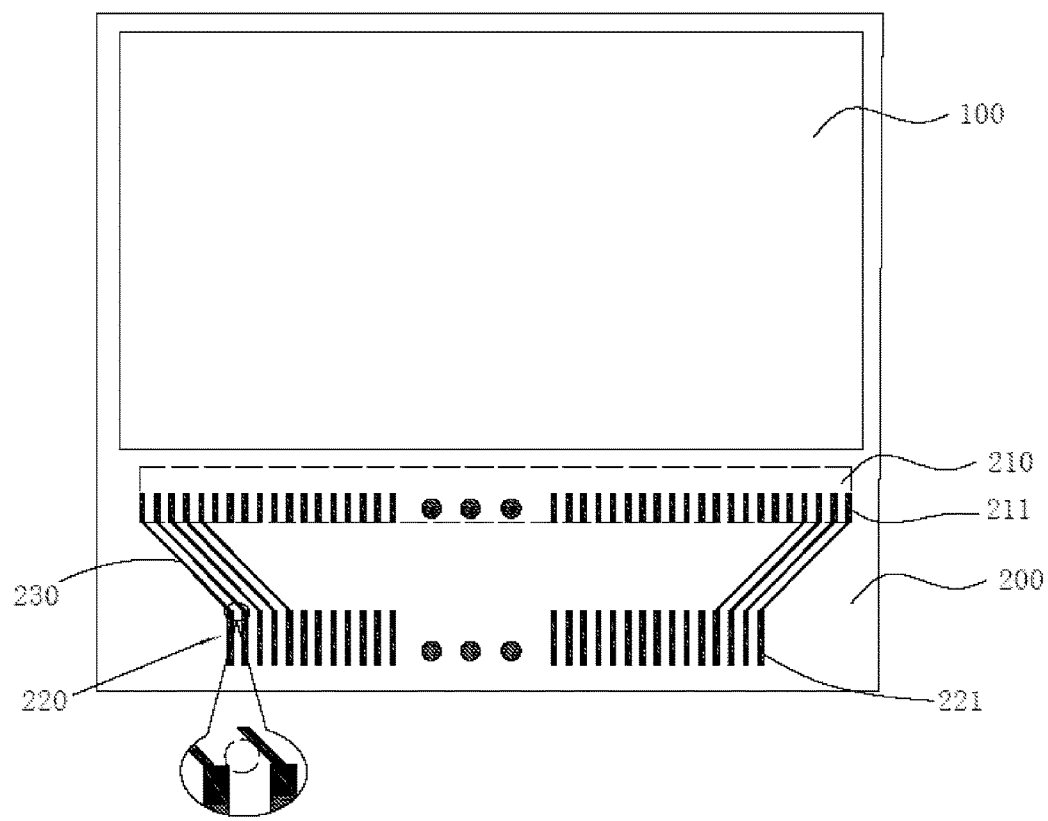
FIG. 1 is a diagram of a liquid crystal display panel according to prior art.
Figure 2:
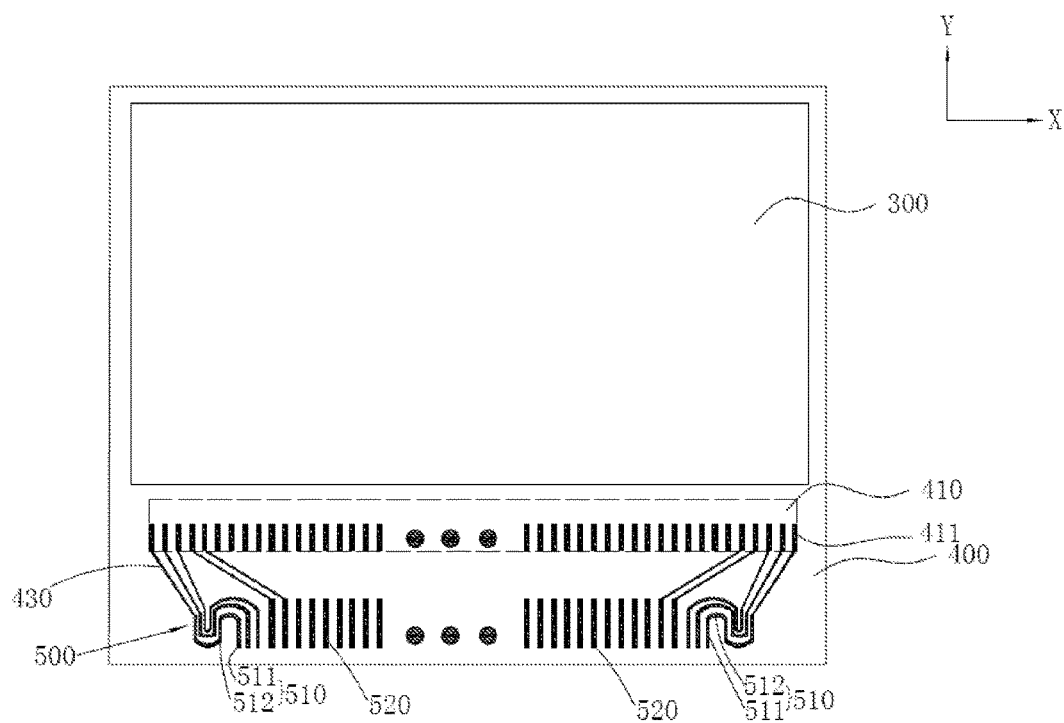
FIG. 2 is a diagram of a liquid crystal display panel according to one embodiment of the present invention.

The embodiment of the present invention provides a narrow frame display panel. The display panel can be a liquid crystal display panel, an organic light emitting diode display panel or the like. Please refer to FIG. 2. The display panel comprises an active area 300 and a peripheral area 400. The display area 300 generally refers to an area showing images, and the peripheral area 400 is arranged around the display area 300. The peripheral area 400 is provided with some electrical components and lines. In this embodiment, the peripheral area 400 comprises an integrated circuit input pad 410 (IC input Pad) and a flexible printed circuit bonding pad 500 (FPC Bonding Pad). The integrated circuit input pad 410 is electrically connected to an integrated circuit board, and the flexible printed circuit bonding pad 500 is electrically connected to a flexible printed circuit.

In this embodiment, the integrated circuit input pad 410 is located on a lower side of the display panel. The flexible printed circuit bonding pad 500 is located on a lower edge of the display panel, and the flexible printed circuit bonding pad 500 is located below the integrated circuit input pad 410. Namely, the flexible printed circuit bonding pad 500 is located on the outer side. The integrated circuit input pad 410 comprises a plurality of input terminals 411, and the plurality of input terminals 411 are electrically connected to the integrated circuit board; the flexible printed circuit bonding pad 500 comprises a plurality of bonding terminals 530, and the plurality of bonding terminals 530 are electrically connected to the flexible printed circuit, and a plurality of wires 430 are provided between the flexible printed circuit bonding pad 500 and the integrated circuit input pad 410, and the wires 430 electrically connect the integrated circuit input pad 410 with the flexible printed circuit bonding pad 500. Specifically, the wires 430 are electrically connected to the input terminals 411 and the corresponding bonding terminals 530, respectively.

In this embodiment, the bonding terminals of at least one end of the flexible printed circuit bonding pad 500 are first bonding terminals 510. Certainly, the bonding terminals of the left end of the flexible printed circuit bonding pad 500 can be the first bonding terminals 510, or the bonding terminals of the right end are the first bonding terminals 510, or the bonding terminals of both the left end and the right end are the first bonding terminals 510. In this embodiment, the bonding terminals of both the left end and the right end of the flexible printed circuit bonding pad 500 are the first bonding terminals 510. The bonding terminals 530 except the first bonding terminals 510 are other bonding terminals 520. For convenience, the other boding terminals are named as the second bonding terminals 520. The second bonding terminals 520 are between the first bonding terminals 510 of the left end and the first bonding terminals 510 of the right end. Each of the first bonding terminals 510 comprises at least one three-side bracketing structure extending outward in a horizontal direction. Certainly, the first bonding terminals 510 can comprise one three-side bracketing structure extending outward in the horizontal direction, two three-side bracketing structures extending outward in the horizontal direction or three three-side bracketing structures extending outward in the horizontal direction. In this embodiment, the first bonding terminal 510 comprises two three-side bracketing structures extending outward in the horizontal direction. Here, extending outward in the horizontal direction refers to the outward extension in the direction of the X-axis or parallel to the X-axis in FIG. 2. The term of outward refers to toward the left and right ends of the display panel.

In this embodiment, the bonding terminals of at least one end of the flexible printed circuit bonding pad 500 are first bonding terminals 510, wherein each of the first bonding terminals 510 comprises at least one three-side bracketing structure extending outward in a horizontal direction, therefore with the space expansion of the flexible printed circuit bonding pad 500 in the horizontal direction, the wires 430 electrically connected to the other bonding terminals 520 adjacent to the first bonding terminals 510 can be more gentle. Then, the distance between the integrated circuit input pad 410 and the flexible printed circuit bonding pad 500 can be decreased, thus being advantageous for narrow frame design of the display panel and the short circuit risk is low; besides, because the first bonding terminal 510 comprises at least one three-side bracketing structure extending outward in the horizontal direction, which is advantageous for the increase of the electrical connection area, there is no problem of insufficient electrical connection area.

In this embodiment, the three-side bracketing structure refers to a frame structure with one-side opening. For instance, the three-side bracketing structure is a U-type structure, a C-type structure, an inverted U-shaped structure, an inverted C-type structure or the like. Here, the U-type structure and the C-type structure are positive three-side bracketing structures, i.e. a frame structure with an upward opening, and the inverted U-shaped structure and the inverted C-type structure are inverted three-side bracketing structures, i.e. a frame structure with a downward opening.

In this embodiment, the first bonding terminal 510 comprises two three-side bracketing structures. Such design can enable the wires 430 electrically connected to the other bonding terminals 520 (the second bonding terminals 520) adjacent to the first bonding terminals 510 to be more gentle and make a width of the flexible printed circuit bonding pad 500 in the left-right direction not increase too much. One of the two three-side bracketing structures is a positive three-side bracketing structure, such as a U-type structure or a C-type structure, wherein the opening of the U-type structure or the C-type structure faces to the integrated circuit input pad 410, and the other is an inverted three-side bracketing structure, such as an inverted U-shaped structure or an inverted C-type structure, wherein the opening of the inverted U-shaped structure or the inverted C-type structure faces away from the integrated circuit input pad 410. In this embodiment, the two three-side bracketing structures are electrically connected, and the two three-side bracketing structures share the vertical part in the middle. In this embodiment, the three-side bracketing structure adjacent to the second bonding terminals 520 is an inverted U-shaped structure or an inverted C-type structure, and the three-side bracketing structure remote from the second bonding terminals 520 is a U-shaped structure or a C-type structure.

In this embodiment, the other bonding terminals 520 except the first bonding terminals 510 are elongated long strips which are equal in length. Namely, the second bonding terminals 520 are elongated long strips which are equal in length. The elongated long strip bonding terminals 530 are between the first bonding terminals 510 at the left end and the first bonding terminals 510 at the right end.

In this embodiment, a number of the bonding terminals at the left end, which are the first bonding terminals 510, is at least two, such as the numbers of two, three, four, five or six. In this embodiment, the number is three. A number of the bonding terminals at the right end, which are the first bonding terminals 510, is at least two, such as the numbers of two, three, four, five or six. In this embodiment, the number is three. Certainly, in other embodiments of the present invention, the number of the bonding terminals at the left end, which are the first bonding terminals, can be one, and the number of the bonding terminals at the right end, which are the first bonding terminals, can also be one. Each of the first bonding terminals 510 comprises a vertical part 511 and a bent part 512. In this embodiment, the vertical part 511 is a vertical strip and the vertical parts 511 and the second bonding terminals 520 are parallel with each other, and the vertical parts 511 are a portion of the first bonding terminals 510 closest to the second bonding terminals 520. Namely, the vertical part 511 is provided adjacent to the center position of the flexible printed circuit bonding pad 500. The bent part 512 has a structure composed of an arc shape and a U shape. The bent part 512 is provided remote from the center position of the flexible printed circuit bonding pad 500. The bent part 512 is connected to one end of the vertical part 511 and horizontally extends toward a center position of the flexible printed circuit bonding pad 500. Namely, the first bonding terminals 510 at the left end horizontally extends toward the left end and the first bonding terminals 510 at the right end horizontally extends toward the right end.

In order to prevent the wires 430 electrically connected to the second bonding terminals 520 adjacent to the first bonding terminals 510 from being short with the first bonding terminals 510 during the manufacture process, in this embodiment, and a length of the vertical parts 511 of the three first bonding terminals 510 at one end is smaller than a length of other bonding terminals 520 except the first bonding terminals 510, i.e. a length of the second bonding terminals 520, and the vertical parts 511 are located on a same horizontal line as ends of the other bonding terminals 520 remote from the wires 430. Thus, the gaps between the wires 430 electrically connected to the second bonding terminals 520 adjacent to the first bonding terminals 510 and the vertical parts 511 can be enlarged to reduce the short circuit risk. Moreover, because the first bonding terminal 510 comprises two three-side bracketing structures, the electrical connection area of the first bonding terminal 510 is larger.

In this embodiment, the vertical parts 511 of the bonding terminals at one end, which are the at least two first bonding terminals 510, are gradually shortened toward the center position of the flexible printed circuit bonding pad 500. Namely, the vertical parts 511 closest to the second bonding terminals 520 are the longest, and the vertical parts 511 are shorter toward the left end or toward the right end. Such design is advantageous for the three-side bracketing structure and can prevent short circuit between the adjacent first bonding terminals 510.

In this embodiment, the wires 430 are electrically connected to ends of the bent parts 520 remote from the vertical parts 510. Namely, the wires 430 electrically connected to the first bonding terminals 510 are electrically connected to the ends of the first bonding terminals 510 remote from the second bonding terminals 520 so that the wires 430 can be prevented from being too tight and leading to a short circuit between the wires 430.

In this embodiment, the wires 430 electrically connected to the first bonding terminals 510 are more steep than the wires 430 electrically connected to the other bonding terminals 520 adjacent to the first bonding terminals 510. Namely, angles between wires 430 electrically connected to the first bonding terminals 510 and a horizontal line are larger than angles between wires 430 electrically connected to other bonding terminals 520 adjacent to the first bonding terminals 510. The first bonding terminals 510 at the left end are illustrated for explanation. Then, the angles between wires 430 electrically connected to the first bonding terminals 510 and a horizontal line (a direction of the X-axis or parallel to the X-axis) are larger than the angles between wires 430 electrically connected to other bonding terminals 520 adjacent to the first bonding terminals 510. Namely, the wires 430 electrically connected to the first bonding terminals 510 are more steep (larger slope), and the wires 430 electrically connected to the other bonding terminals 520 adjacent to the first bonding terminals 510 are relatively more gentle (smaller slope).

The embodiment of the present invention further provides a display. The display can be a liquid crystal display, or an organic light emitting diode display. The display comprises:

a display panel, which is the aforesaid display panel;

a flexible printed circuit board, being electrically connected to the flexible printed circuit bonding pad, wherein specifically, the flexible printed circuit board is electrically connected to the flexible printed circuit bonding pad via the ACF (Anisotropic Conductive Film), and such connection is known in this art and will not be described here;

an integrated circuit board, being electrically connected to the integrated circuit input pad, wherein specifically, the integrated circuit board is electrically connected to the integrated circuit input pad via the ACF, and such connection is known in this art and will not be described here.

Significantly, each of the embodiments in the specification is described in a progressive manner, and each embodiment focuses on the differences from other embodiments, and the same or similar parts among the various embodiments can be referred to one another. For the embodiment of the device, it is basically similar with the embodiment of method, so the description is simpler, and the related parts can be referred to the description of the embodiment of method.

With the description of the foregoing embodiment, the present invention has advantages below: bonding terminals of at least one end of the flexible printed circuit bonding pad are first bonding terminals, wherein each of the first bonding terminals comprises at least one three-side bracketing structure extending outward in a horizontal direction, therefore with the space expansion of the flexible printed circuit bonding pad in the horizontal direction, the wires electrically connected to the other bonding terminals adjacent to the first bonding terminals can be more gentle. Then, the distance between the integrated circuit input pad and the flexible printed circuit bonding pad can be decreased, thus being advantageous for narrow frame design of the display panel and the short circuit risk is low; besides, because the first bonding terminal comprises at least one three-side bracketing structure extending outward in the horizontal direction, which is advantageous for the increase of the electrical connection area, there is no problem of insufficient electrical connection area.

Above are embodiments of the present invention, which does not limit the scope of the present invention. Any equivalent amendments within the spirit and principles of the embodiment described above should be covered by the protected scope of the invention.

What is claimed is:

1. A narrow frame display panel, comprising: an integrated circuit input pad, being located on a lower side of the display panel and comprising a plurality of input terminals; a flexible printed circuit bonding pad, being located on a lower edge of the display panel and below the integrated circuit input pad, and the flexible printed circuit bonding pad comprising a plurality of bonding terminals, and bonding terminals of at least one end of the flexible printed circuit bonding pad are first bonding terminals, wherein each of the first bonding terminals comprising at least one three-side bracketing structure extending outward in a horizontal direction; wires, electrically connecting the integrated circuit input pad with the flexible printed circuit bonding pad; wherein a number of the bonding terminals at one end, which are the first bonding terminals, is at least two, and each of the first bonding terminals comprises a vertical part and a bent part, and the bent part is connected to one end of the vertical part and horizontally extends toward a center position of the flexible printed circuit bonding pad, and a length of the vertical part is smaller than a length of other bonding terminals except the first bonding terminals, and the vertical part is located on a same horizontal line as ends of the other bonding terminals remote from the wires except the first bonding terminals.

2. The narrow frame display panel according to claim 1, wherein bonding terminals at left and right end of the flexible printed circuit bonding pad are the first bonding terminals.

3. The narrow frame display panel according to claim 2, wherein a number of the bonding terminals at one end, which are the first bonding terminals, is at least two, and each of the first bonding terminals comprises a vertical part and a bent part, and the bent part is connected to one end of the vertical part and horizontally extends toward a center position of the flexible printed circuit bonding pad, and a length of the vertical part is smaller than a length of other bonding terminals except the first bonding terminals, and the vertical part is located on a same horizontal line as ends of the other bonding terminals remote from the wires except the first bonding terminals.

4. The narrow frame display panel according to claim 1, wherein the vertical parts of the at least two first bonding terminals are gradually shortened toward the center position of the flexible printed circuit bonding pad.

5. The narrow frame display panel according to claim 1, wherein the other bonding terminals except the first bonding terminals are elongated long strips which are equal in length.

6. The narrow frame display panel according to claim 1, wherein the wires are electrically connected to ends of the bent parts remote from the vertical parts.

7. The narrow frame display panel according to claim 1, wherein the each of the first bonding terminals comprises two three-side bracketing structures, and one of the two three-side bracketing structures is a positive three-side bracketing structure and the other is an inverted three-side bracketing structure.

8. The narrow frame display panel according to claim 1, wherein the three-side bracketing structure is a U-type structure, a C-type structure, an inverted U-shaped structure or an inverted C-type structure.

9. The narrow frame display panel according to claim 1, wherein angles between wires electrically connected to the first bonding terminals and a horizontal line are larger than angles between wires electrically connected to other bonding terminals adjacent to the first bonding terminals.

10. A display, comprising: a display panel, comprising: an integrated circuit input pad, being located on a lower side of the display panel and comprising a plurality of input terminals; a flexible printed circuit bonding pad, being located on a lower edge of the display panel and below the integrated circuit input pad, and the flexible printed circuit bonding pad comprising a plurality of bonding terminals, and bonding terminals of at least one end of the flexible printed circuit bonding pad are first bonding terminals, wherein each of the first bonding terminals comprising at least one three-side bracketing structure extending outward in a horizontal direction; wires, electrically connecting the integrated circuit input pad with the flexible printed circuit bonding pad; a flexible printed circuit board, being electrically connected to the flexible printed circuit bonding pad; an integrated circuit board, being electrically connected to the integrated circuit input pad, wherein a number of the bonding terminals at one end, which are the first bonding terminals, is at least two, and each of the first bonding terminals comprises a vertical part and a bent part, and the bent part is connected to one end of the vertical part and horizontally extends toward a center position of the flexible printed circuit bonding pad, and a length of the vertical part is smaller than a length of other bonding terminals except the first bonding terminals, and the vertical part is located on a same horizontal line as ends of the other bonding terminals remote from the wires except the first bonding terminals.

11. The display according to claim 10, wherein bonding terminals at left and right end of the flexible printed circuit bonding pad are the first bonding terminals.

12. The display according to claim 11, wherein a number of the bonding terminals at one end, which are the first bonding terminals, is at least two, and each of the first bonding terminals comprises a vertical part and a bent part, and the bent part is connected to one end of the vertical part and horizontally extends toward a center position of the flexible printed circuit bonding pad, and a length of the vertical part is smaller than a length of other bonding terminals except the first bonding terminals, and the vertical part is located on a same horizontal line as ends of the other bonding terminals remote from the wires except the first bonding terminals.

13. The display according to claim 10, wherein the vertical parts of the at least two first bonding terminals are gradually shortened toward the center position of the flexible printed circuit bonding pad.

14. The display according to claim 10, wherein the other bonding terminals except the first bonding terminals are elongated long strips which are equal in length.

15. The display according to claim 10, wherein the wires are electrically connected to ends of the bent parts remote from the vertical parts.

16. The display according to claim 10, wherein the each of the first bonding terminals comprises two three-side bracketing structures, and one of the two three-side bracketing structures is a positive three-side bracketing structure and the other is an inverted three-side bracketing structure.

17. The display according to claim 10, wherein the three-side bracketing structure is a U-type structure, a C-type structure, an inverted U-shaped structure or an inverted C-type structure.

18. The display according to claim 10, wherein angles between wires electrically connected to the first bonding terminals and a horizontal line are larger than angles between wires electrically connected to other bonding terminals adjacent to the first bonding terminals.

* * * * *